United States Patent [19]
Parris et al.

[11] Patent Number: 5,763,298
[45] Date of Patent: Jun. 9, 1998

[54] BOND PAD OPTION FOR INTEGRATED CIRCUITS

[75] Inventors: Michael Parris; Michael V. Cordoba, both of Colorado Springs, Colo.

[73] Assignees: United Memories, Inc., Colorado Springs, Colo.; Nippon Steel Semiconductor Corporation, Japan

[21] Appl. No.: 868,179

[22] Filed: Jun. 3, 1997

Related U.S. Application Data

[62] Division of Ser. No. 437,811, May 9, 1995, Pat. No. 5,698,903.

[51] Int. Cl.$^6$ ............................................... H01C 2/208
[52] U.S. Cl. ................................................ 438/128; 438/129
[58] Field of Search .................................. 438/128, 129, 438/130, 131, 132

[56] References Cited

U.S. PATENT DOCUMENTS

| | | |
|---|---|---|
| 4,985,641 | 1/1991 | Nagayama et al. |
| 5,285,069 | 2/1994 | Kaibara et al. |
| 5,303,180 | 4/1994 | McAdams |

FOREIGN PATENT DOCUMENTS

| | | |
|---|---|---|
| 3911450A1 | 11/1989 | Germany |
| 2215512 | 2/1988 | United Kingdom |

*Primary Examiner*—Carl W. Whitehead
*Attorney, Agent, or Firm*—Edward D. Manzo; Mark J. Murphy

[57] ABSTRACT

An integrated circuit having a first and second bond pads, a latch circuit, and a voltage lead. Different configurations of the internal circuitry of the integrated circuit are selected by applying the voltage lead either to the first or second bond pads. This result is achieved because the latch circuit, coupled between the first and second bond pads, is capable of inverting the voltage response seen at the first bond pad.

2 Claims, 6 Drawing Sheets

5,763,298

BOND PAD OPTION FOR INTEGRATED CIRCUITS

This application is a division of Ser. No. 08/437,811 filed May 9, 1995 now U.S. Pat. No. 5,698,903.

TECHNICAL FIELD

This invention is directed to integrated circuits, and particularly to integrated circuits with an improved structure for selecting between different functional configurations of the same integrated circuit.

BACKGROUND OF THE INVENTION

Manufacturers commonly fabricate integrated circuits so that a single integrated circuit can be configured as one of several different functional products. For example, a single integrated circuit may be configured to have either a single output or four outputs. For simplicity, such an integrated circuit will be termed a multi-configurable integrated circuit.

By fabricating integrated circuits which can be configured into any of several different functional products, manufacturers seek to capitalize on a number of advantages. Multi-configurable integrated circuits permit greater flexibility in meeting customer design requirements. Such circuits also allow reduced tooling and fabrication costs—as some of the steps which would be duplicated during production of separate functional products can be eliminated by producing a single, multi-configurable integrated circuit. The multi-configurable integrated circuit also reduces the necessity to keep a large inventory of several functionally different integrated circuit reticle sets on hand so as to meet the customers' needs.

One way of manufacturing a multi-configurable integrated circuit is to alter one of the mask layers during the masking stage of wafer fabrication. Commonly, the last layer to be applied is altered. Using the last layer has two advantages. First, by using the last layer, the manufacturer is given greater flexibility before committing to a given functional product. Second, by using the last layer, the manufacturer saves tooling costs by amortizing the expense of the first several layers over several different products. In a modern CMOS process, the cost of fabricating as many as twenty-five different layers can be amortized in this manner over several different functional products.

A second way of manufacturing a multi-configurable integrated circuit is to alter the bonding of the lead frame to the integrated circuit during packaging. This second option, or bond pad option, permits an even greater cost savings and flexibility over the mask option previously discussed. The added cost savings is achieved because the same mask can be used for several different products. A greater flexibility is also achieved in the bond bad option because the decision to configure an item to a given functional product is delayed until even later in the fabrication process.

FIGS. 1(a) and 1(b) show a multi-configurable integrated circuit fabricated according to the bond pad option of the prior art. FIGS. 1(a) and 1(b) show an integrated circuit 10 having internal circuitry 20. A plurality of bond pads 40 are located along the periphery of integrated circuit 10. Bond pads 40 function as attachment sites where a lead frame comprised of a plurality of leads 30 can be connected to integrated circuit 10.

By attaching a lead 30 at the proper bond pad 40, internal circuitry 20 of integrated circuit 10 can be configured as either functional product A or functional product B. To select functional product A, for example, a lead 31 for use in the option can be bonded during the packaging step to a bond pad 43 which is connected to internal circuitry 20 via a conductive line 21, as shown in FIG. 1(a). During operation, lead 31 will be at Vcc, and thus line 21 is held at Vcc. Further by way of illustration, to select functional product B, a lead 33 may be bonded during the packaging step to a bond pad 49, as shown in FIG. 1(b). During the operation of integrated circuit 10, lead 33 will be at Vss.

In many integrated circuits, such as circuit 10 in FIGS. 1(a) and 1(b), leads 31 and 33 are located at opposite ends of integrated circuit 10. As a result, a conductive line 60 must be routed on integrated circuit 10 to allow the option aspects of internal circuitry 20 of circuit 10 to receive either Vcc or Vss through leads 31 and 33 and bond pads 43 and 49, respectively, so that functional product A or B may be chosen. (Of course, the normal Vcc and VSS power supplies are also provided, preferably via other dedicated Vcc and Vss connections to power the internal circuitry 20.)

The additional conductive line 60 needed to couple circuit 20 either Vcc or Vss for the bond pad option creates a significant problem. By routing conductive line 60 across the entire length of circuit 10, additional area is required to accommodate the line 60. This need for additional area in turn increases the overall size of integrated circuit 10.

Therefore, one object of the invention is to decrease the cost of fabrication and size requirements for integrated circuits.

A second object of the invention is to localize the circuitry responsible for configuring the integrated circuit into different functional products to a limited area of the integrated circuit.

SUMMARY OF THE INVENTION

An integrated circuit constructed according to aspects of the present invention comprises first and second bond pads, either of which may be connected to a voltage lead. A circuit, preferably a pair of cross-coupled inverters or other latch circuit, is coupled between the first and second bond pads. The circuit responds to a voltage at the first bond pad to provide an inverted signal at the second bond pad. Therefore, the integrated circuit can be assembled such that connecting a voltage lead to the first bond pad configures the internal circuitry of the integrated circuit into a first functional mode, while connecting the voltage lead to the second bond pad configures the internal circuitry of the integrated circuit into a second functional mode.

Further, a method of executing a bond-pad option for an integrated circuit according to method aspects of the present invention includes the steps of providing or obtaining an integrated circuit having internal circuitry and a plurality of bond pads, two of which are for a bond pad option. The method further includes connecting a source of a first power supply voltage to a selected one of said bond pad option bond pads, and locally inverting the voltage from one said option bond pad to the other option bond pad. Lastly, the method includes coupling one of said bond pads to portions of said internal circuitry responsive to a selection of said first power supply voltage or a second power supply voltage.

BRIEF DESCRIPTION OF THE DRAWINGS

In describing the preferred embodiments of the present invention, reference is made to the accompanying drawings wherein like parts having like reference numerals, and wherein.

DESCRIPTION OF THE PREFERRED EMBODIMENTS

Figure 1A:
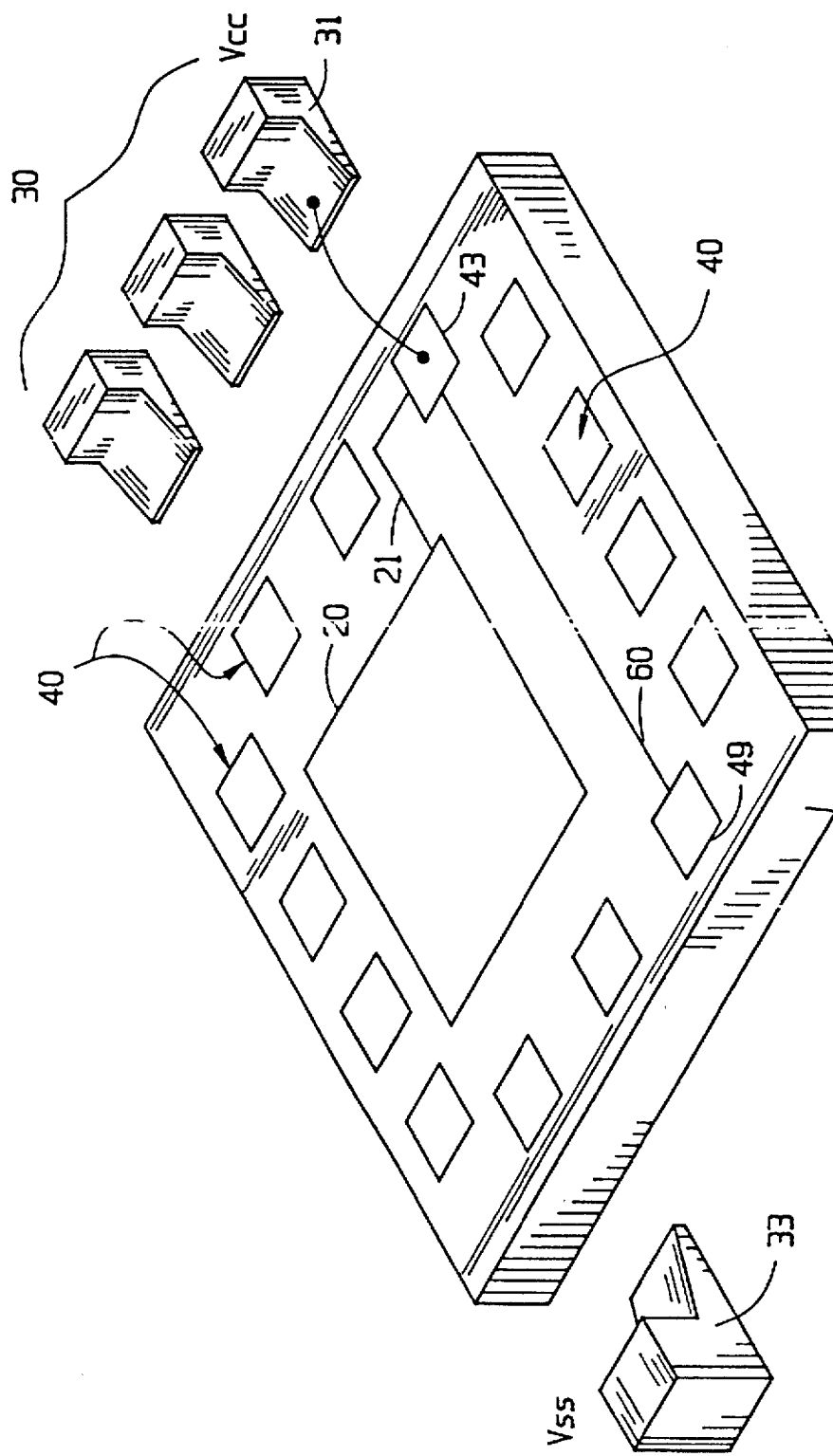
FIG. 1(a) illustrates a bond pad option of the prior art selected to configure the internal circuitry of an integrated circuit into a first functional mode.
Figure 1B:
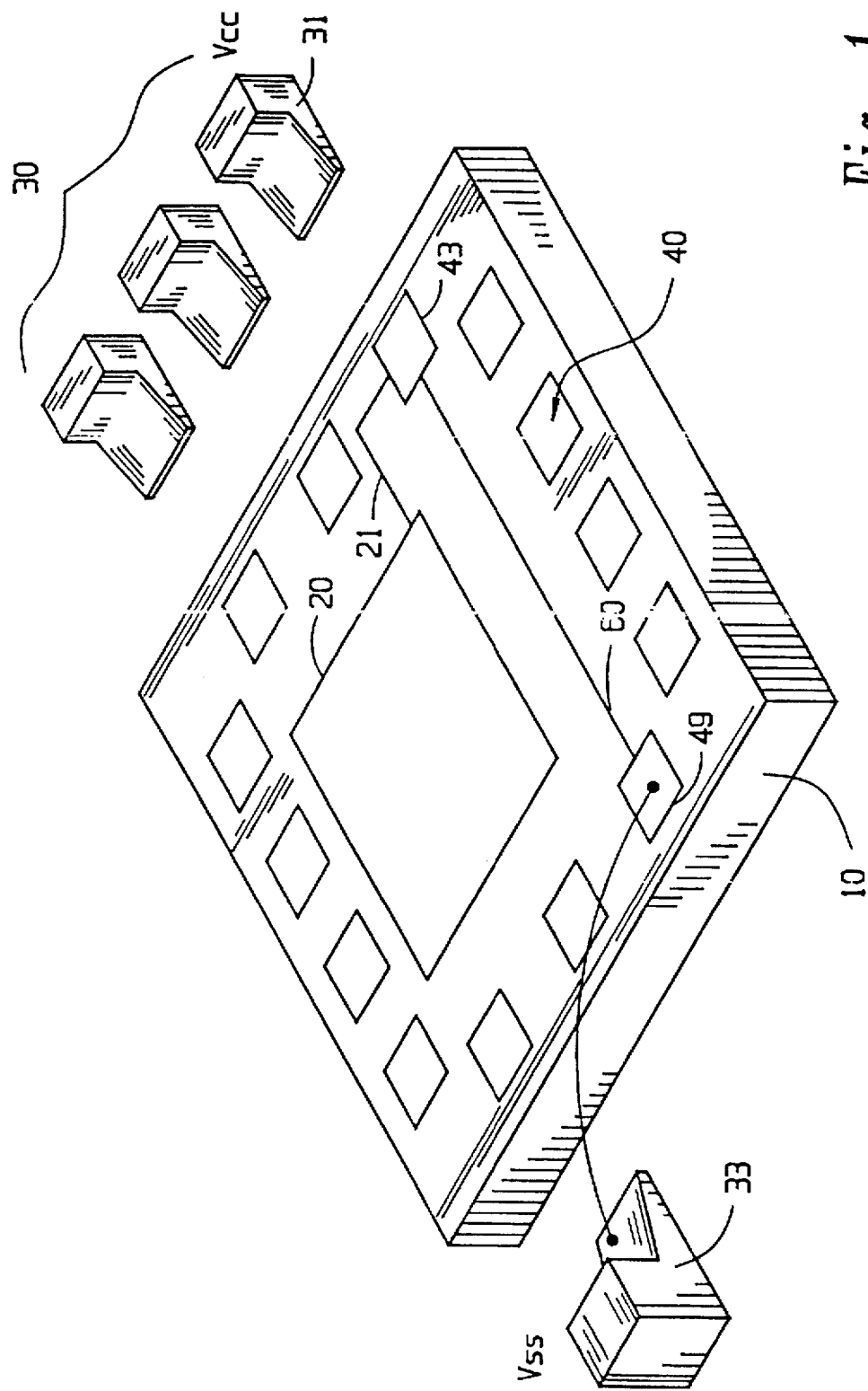
FIG. 1(b) illustrates a bond pad option of the prior art selected to configure the same internal circuitry of the same integrated circuit into a second functional mode.
Figure 2A:
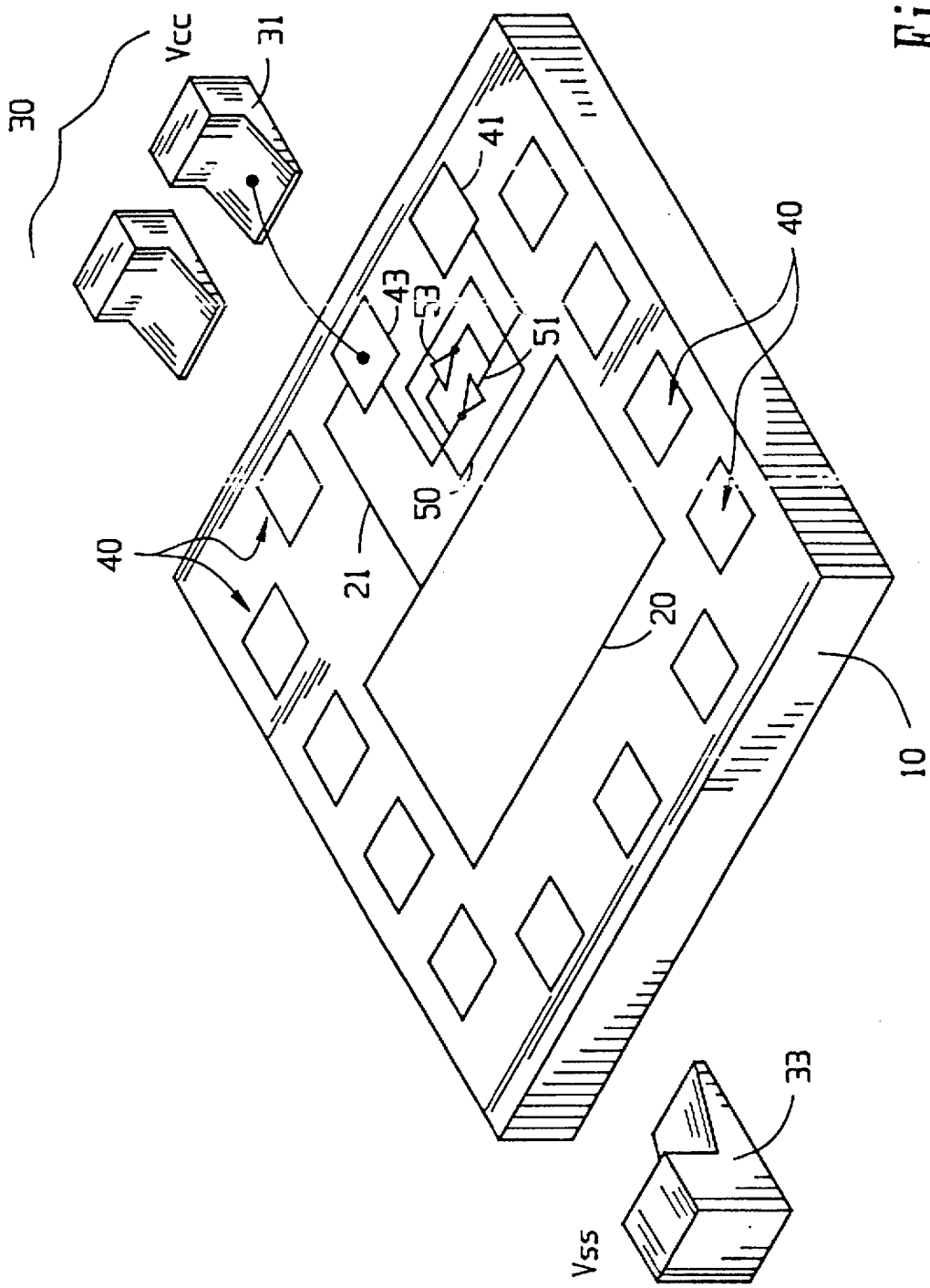
FIG. 2(a) illustrates a first preferred embodiment of the bond pad option according to the present invention selected to configure the internal circuitry of an integrated circuit into a first functional mode.
Figure 2B:
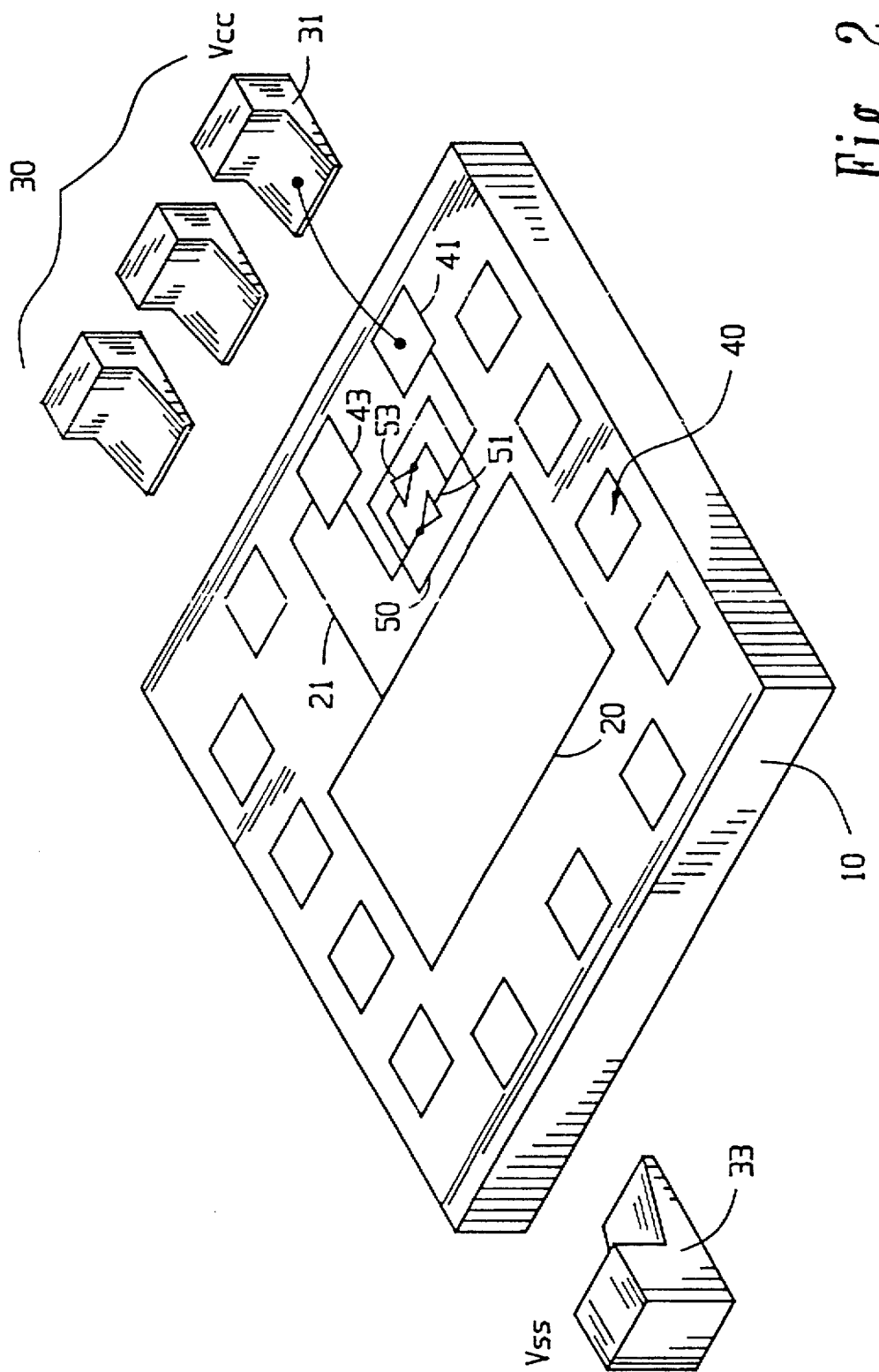
FIG. 2(b) illustrates how the embodiment of FIG. 2(a) can be instead be used to configure the internal circuitry of the integrated circuit into a second functional mode.

FIGS. 2(a) and 2(b) show an integrated circuit 10, with internal circuitry 20 and a plurality of leads 30, according to a first preferred embodiment of the present invention. Along the periphery of integrated circuit 10 are a plurality of bond pads 40 for connecting internal circuitry 20 of integrated circuit 10 with a lead frame comprised of a plurality of leads 30. Bond pads 40 include bond pads 41, 43, 47, and 49, referred to below. Integrated circuit 10 may comprise a memory chip or a processor chip, or other type of integrated circuit. Typically, integrated circuit 10 includes a substrate, usually of silicon, but other or additional materials can be used. The exact nature of the integrated circuit 10 can be varied within the scope of the present invention.

Among leads 30 which can be connected to bond pads 40 are two leads used for bond pad options, namely lead 31 and lead 33. In operation, lead 31 would be coupled to a Vcc voltage source. In contrast, in operation, lead 33 would be coupled to a Vss voltage source. These sources may be specific pins for Vcc or Vss, or may be connections within the integrated circuit package to the Vcc or Vss power supplies, or other sources.

Preferably, as shown in FIGS. 2(a) and (b), a latch circuit 50 is connected at one side to bond pad 41 and at the other side to bond pad 43. Preferably, bond pad 43 is coupled to not only latch circuit 50, but also to internal circuitry 20 of integrated circuit 10 via a line 21. Either bond pad 41 or bond pad 43 may be connected to Vcc lead 31 during the packaging of integrated circuit 10. At no time during the packaging of integrated circuit 10 should Vcc lead 31 be attached or connected directly to both bond pads 41 and 43.

Latch circuit 50 comprises a circuit that will control a voltage at one of the bond pads. It preferably comprises at least one inverter, but more preferably comprises a pair of cross-coupled inverters or NOT gates 51 and 53. Inverters 51 and 53 are well known in the art. According to the first preferred embodiment of the present invention, inverter 51 is coupled at its output to bond pad 43 and at its input to bond pad 41. Inverter 53 has its input and output connected respectively to bond pads 43 and 41.

In operation, Vcc lead 31 is connected (by wire bonding for example) to a selected one of either bond pad 41 or bond pad 43, and thus it will be understood that in this embodiment, the number of leads 30 is less than the number of bond pads 40, permitting one or more bond pads to remain unconnected to a lead. In other embodiments, all bond pads could be used selectively. As shown in FIG. 2(a), if Vcc lead 31 is attached to bond pad 43, then internal circuitry 20 will be configured according to an input of Vcc.

As shown in FIG. 2(b), if Vcc lead 31 is attached instead to bond pad 41, and not to bond pad 43, then the internal circuitry 20 will be configured according to an input of Vss in the following fashion. With Vcc lead 31 attached to bond pad 41, latch circuit 50 will see a voltage Vcc at bond pad 41. In response to a voltage Vcc at bond pad 41, latch circuit 50 will provide an inverted voltage Vss at bond pad 43. As bond pad 43 is connected to internal circuitry 20 via line 21, internal circuitry 20 will be configured to an input voltage of Vss, although the voltage applied to bond pad 41 is Vcc.

It will be appreciated that bond pads 41 and 43 are used here for bond pad options. Preferably, another one of bond pads 40 will be assigned to Vcc, and yet another one to Vss. Preferably, integrated circuit 10 will have a Vcc bus around all or a portion of the periphery of integrated circuit 10, and such Vcc bus will be connected to the dedicated Vcc bond pad. Correspondingly, integrated circuit 10 also preferably includes a Vss bus around all or a portion of the periphery of integrated circuit 10, and such Vss bus will be connected to the dedicated Vss bond pad. The dedicated Vcc and Vss bond pads will be connected to the Vcc and Vss input pins or other means by which power is supplied to integrated circuit 10. Preferably, latch 50 takes its power from the Vcc and Vss bus.

Use of latch circuit 50 has a number of advantages over the prior art. One advantage is that latch circuit 50 consumes much less area than the conductive line 60 used in the prior art bond pad option. Further, the size of latch circuit 50 can be substantially reduced, as latch circuit 50 operates with a constant input voltage and will not change its output voltage level after the bonding step occurs.

Figure 3A:
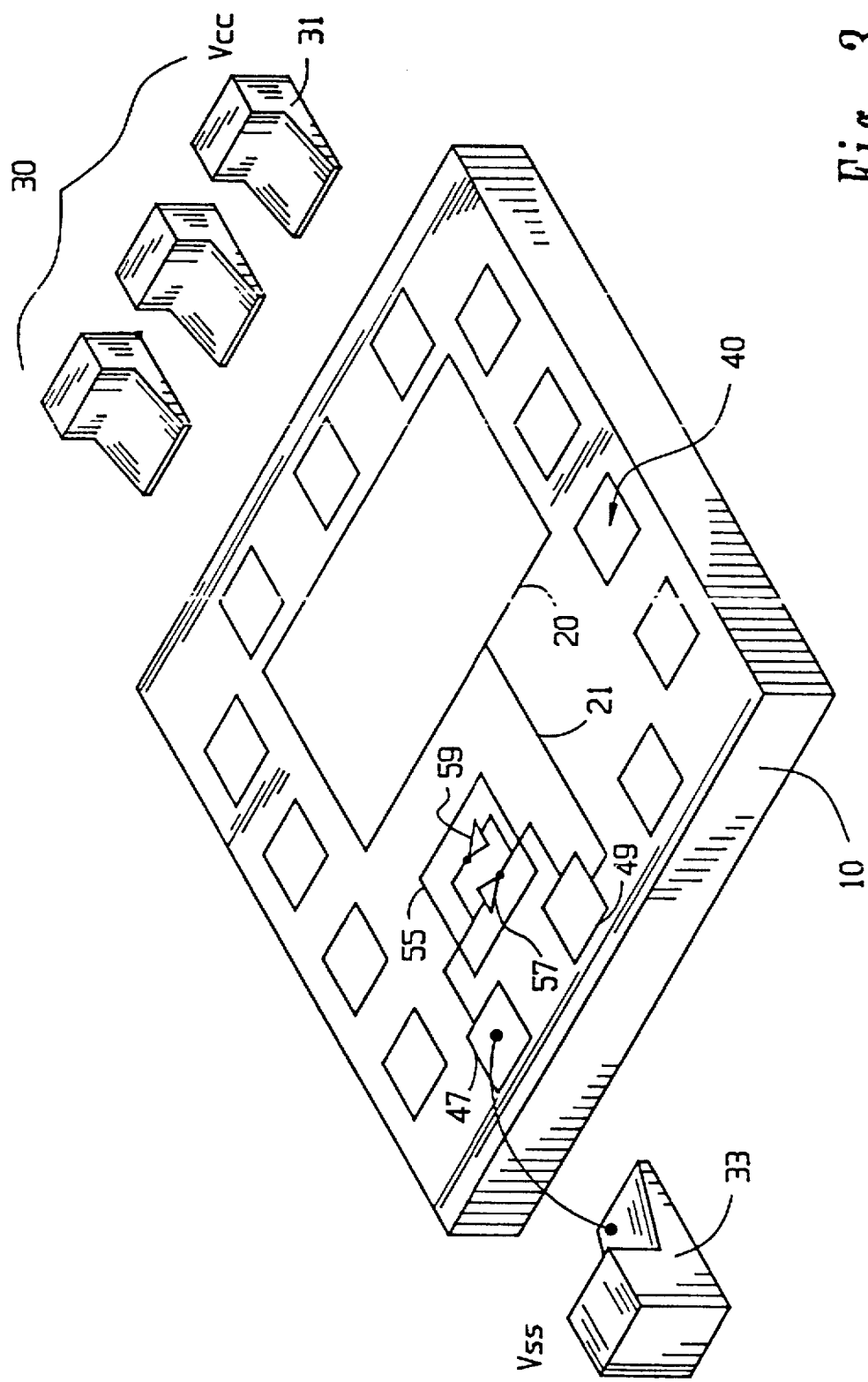
FIG. 3(a) illustrates a second preferred embodiment of the bond pad option according to the present invention selected to configure the internal circuitry of the integrated circuit into a first functional mode.
Figure 3B:
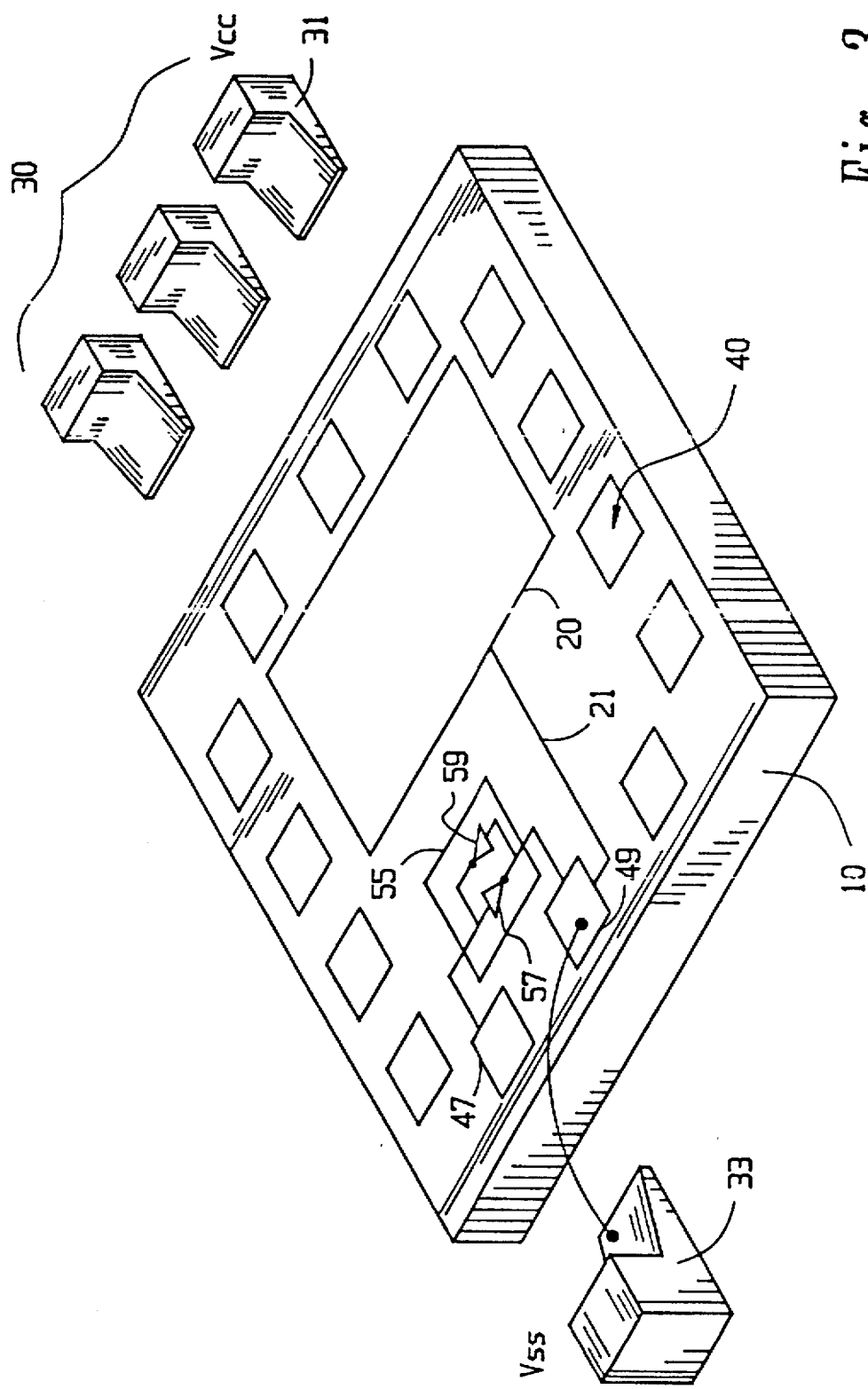
FIG. 3(b) illustrates how the embodiment of FIG. 3(a) can instead be used to configure the internal circuitry of the integrated circuit into a second functional mode.

Alternatively, a latch circuit can be used with the Vss lead 33. According to a second preferred embodiment of the present invention, FIG. 3(a) and 3(b) show integrated circuit 10 and Vss lead 33 which is set at (connected to) Vss during operation. In a fashion similar to that described above, a first bond pad 47 and a second bond pad 49 are connected to respective sides of a latch circuit 55. Bond pad 49 is connected also to internal circuitry 20 of integrated circuit 10 via a line 21. Vss lead 33 can be connected to either bond pad 47 or 49, but not both pads at the same time. Latch circuit 55 preferably includes two cross-coupled inverters 57 and 59, connected as shown.

During the packaging stage of fabrication, Vss lead 33 can be connected by wire bonding or otherwise to either bond pad 47 or bond pad 49. If, as shown in FIG. 3(a), Vss lead 33 is attached to bond pad 47, internal circuitry 20 of integrated circuit 10 is configured to a first functional mode according to an input of Vcc. This configuration occurs because latch circuit 55 inverts the voltage provided at bond pad 47, thus providing a voltage of Vcc to internal circuitry 20 via bond pad 49 and line 21.

If, on the other hand, as shown in FIG. 3(b), Vss lead 33 is attached to bond pad 49, then internal circuitry 20 will be configured to a second functional mode according to an input voltage of Vss. This functional mode corresponds to the mode produced by connecting Vcc lead 31 to bond pad 41 in the first embodiment of the present invention.

In the foregoing embodiments, a bond pad option has been made available so that, in one embodiment, the manufacturer or an assembler chooses which bond pad 40 to connect to a Vcc source, and in the other embodiment, chooses which bond pad 40 to connect to a Vss source. The Vcc or Vss source illustratively is a wire or lead to a pin, but could alternatively comprise a wire or lead to a dedicated Vcc pad or pin, or to a dedicated Vss pad or pin. In any case, the use of a local latch circuit, or an inverting circuit, obviates the need for the cumbersome and space-consuming conductive line 60 which would otherwise be necessary to allow the bond pad option to work.

The internal circuitry of integrated circuit 10 will receive the Vcc or Vss option signal and from it will be configured as the manufacturer has arranged. For example, the bond pad option can be used to choose whether integrated circuit 10, if a memory, is a 1-by-4, 4-by-8, 8-by-16, etc. or whether it uses 2k or 4k cycles for full refresh, or other options desired by the manufacturer (or end user).

While this invention has been described with reference to an illustrative embodiment, it will be understood that this description is not intended to be construed in a limiting sense. Various modification of the illustrative embodiments, as well as other embodiments, will become apparent to those skilled in the art upon reference to this description. The invention is intended to be set forth in the following claims.

We claim:

1. In a method of assembling an integrated circuit, a method of executing a package bond mode selection for the integrated circuit including the steps of:

providing an integrated circuit having internal circuitry and a plurality of bond pads, two of which are located in a localized area for mode selection bonding; and connecting a source of a power supply voltage from a lead frame to a selected one of said mode selection bond pads in said localized area;

wherein said integrated circuit includes a circuit for locally inverting the power supply voltage from one said mode selection bond pad to the other mode selection bond pad; and wherein said integrated circuit includes a connection for coupling one of said mode selection bond pads to portions of said internal circuitry;

so that the method of assembling selects between first and second modes of operation of the integrated circuit depending on which mode selection bond pad is connected to said source of a power supply voltage, which determines whether said power supply voltage is to be inverted or not inverted by the circuit for locally inverting.

2. A method of operating an integrated circuit having package bond mode selection circuitry thereon, including the steps of applying a power supply voltage to a voltage lead for the integrated circuit, said integrated circuit having internal circuitry and a plurality of bond pads, a first one of said bond pads being adjacent to a second one of said bond pads, said second bond pad being coupled to the internal circuitry of the integrated circuit device;

said integrated circuit connecting said voltage lead and said power supply voltage to a selected one of said mode selection bond pads in a localized area;

said integrated circuit locally inverting the power supply voltage from said first bond pad to said second bond pad if said first bond pad is connected to said voltage lead and said second bond pad is unconnected to said lead, and providing said inverted power supply voltage from said second bond pad to the internal circuitry of the integrated circuit device; and said integrated circuit providing said power supply voltage from said second bond pad to the internal circuitry of the integrated circuit device if said second bond pad is connected to said voltage lead and said first bond pad is unconnected to said lead.

* * * * *